(12) United States Patent
Myers

(10) Patent No.: US 12,388,401 B2
(45) Date of Patent: Aug. 12, 2025

(54) SWITCHABLE NMOS-CMOS VOLTAGE-CONTROLLED OSCILLATOR (VCO) WITH SHARED INDUCTOR-CAPACITOR (LC) TANK

(71) Applicant: Cypress Semiconductor Corporation, San Jose, CA (US)

(72) Inventor: Edward Daniel Myers, Oakland, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 8 days.

(21) Appl. No.: 18/511,570

(22) Filed: Nov. 16, 2023

(65) Prior Publication Data

US 2025/0167732 A1 May 22, 2025

(51) Int. Cl.
*H03B 5/12* (2006.01)
(52) U.S. Cl.
CPC ......... *H03B 5/1212* (2013.01); *H03B 5/1228* (2013.01); *H03B 2200/009* (2013.01)

(58) Field of Classification Search
CPC ............. H03B 5/1212; H03B 5/1228; H03B 2200/009
USPC ............................. 331/167, 117 FE, 116 FE
See application file for complete search history.

(56) References Cited

U.S. PATENT DOCUMENTS

| | | | |
|---|---|---|---|
| 10,819,277 B2 * | 10/2020 | Zhou | H03B 5/124 |
| 2015/0180414 A1 * | 6/2015 | Lee | H03L 7/089 |
| | | | 331/115 |

FOREIGN PATENT DOCUMENTS

WO    WO-2021081950 A1 *  5/2021  ........... H03B 5/1212

\* cited by examiner

*Primary Examiner* — Arnold M Kinkead

(57) ABSTRACT

A voltage-controlled oscillator (VCO) includes a cross-coupled differential pair of n-type metal-oxide semiconductor (NMOS) transistors. The VCO further includes an inductor-capacitor (LC) tank circuit coupled to the cross-coupled differential pair of NMOS transistors. The VCO further includes cross-coupled pairs of complementary MOS (CMOS) transistors selectively coupled to the LC tank circuit.

19 Claims, 5 Drawing Sheets

SWITCHABLE NMOS-CMOS VOLTAGE-CONTROLLED OSCILLATOR (VCO) WITH SHARED INDUCTOR-CAPACITOR (LC) TANK

TECHNICAL FIELD

The disclosure relates generally to the field of frequency generation or frequency control, and in particular, to a switchable n-type metal-oxide semiconductor (NMOS)-complimentary MOS (CMOS) voltage-controlled oscillator (VCO) with a shared inductor-capacitor (LC) tank.

BACKGROUND

Electronic circuits may include individual electronic components, such as resistors, transistors, and capacitors, among others, connected by conductive wires or traces through which electric current can flow. Electronic circuits may be constructed using discrete components, or more commonly integrated in an integrated circuit (IC) where the components and interconnections are formed on a common substrate, such as silicon. An IC-based VCO typically includes a combination of resistors, transistors, and one or more inductor and capacitor.

BRIEF DESCRIPTION OF THE DRAWINGS

The disclosure is illustrated by way of example, and not of limitation, in the figures of the accompanying drawings.

DETAILED DESCRIPTION

Figure 1:
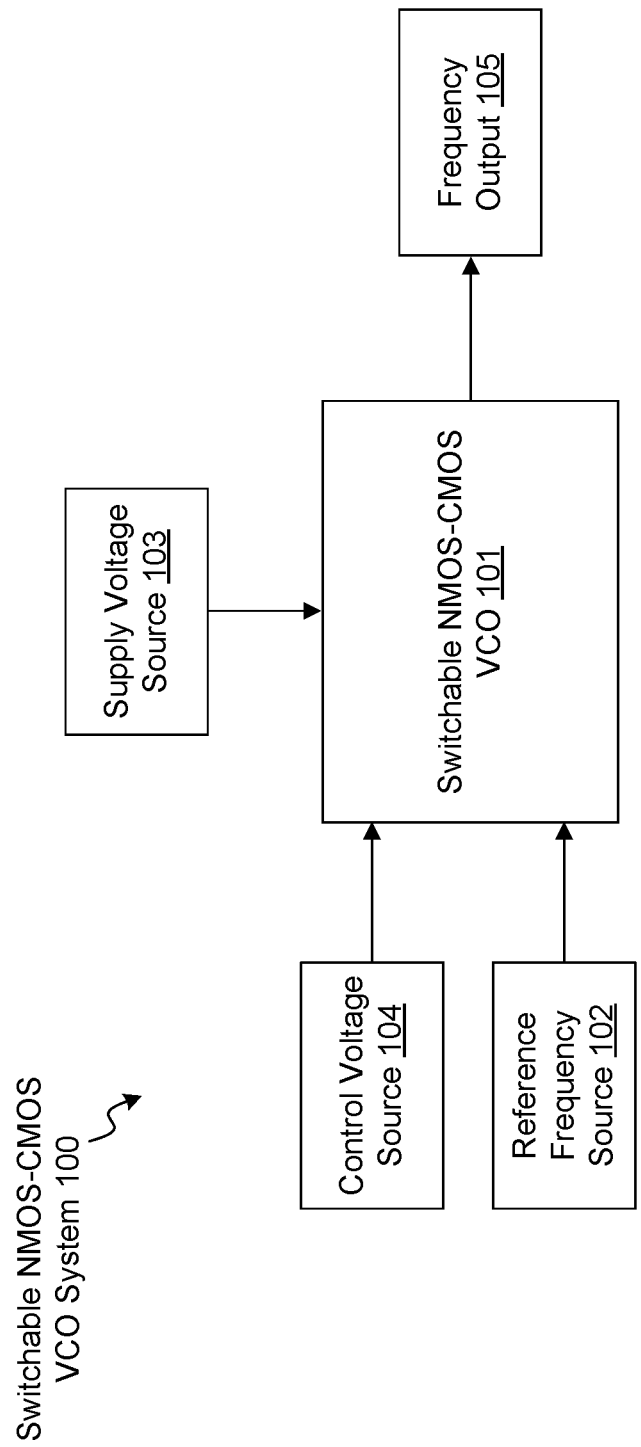
FIG. 1 is a block diagram of a switchable n-type metal-oxide semiconductor (NMOS)-complimentary MOS (CMOS) voltage-controlled oscillator (VCO) system, according to some embodiments.

The phase noise of a voltage-controlled oscillator (VCO) is intrinsically tied to its current consumption, presenting challenges for achieving both high-performance and low-power operation. Leeson's formula, a fundamental concept in oscillator theory, relates the phase noise of an oscillator to its power consumption and quality factor (Q). Leeson's formula underscores the challenge of balancing high-performance requirements and low power consumption in VCOs by highlighting the intrinsic relationship between phase noise and current draw, which can impact the adaptability and capabilities of the oscillator.

Consider a scenario where a high-performance VCO is implemented using an n-type metal-oxide semiconductor (NMOS) inductor-capacitor (LC) VCO configuration. The NMOS LC VCO can successfully meet stringent 4k-quadrature amplitude modulation (QAM) phase noise requirements, but draws excessive current, particularly when in listen mode. This is because a VCO is always on when a radio, which incorporates the VCO, is transmitting or receiving and can draw excessive current even when in listen mode. This current consumption can be reduced slightly; however, there is a limit on how far the current draw can be reduced due to process and temperature spread.

On the other hand, a low-power VCO employing a standard complementary MOS (CMOS) LC VCO implementation can satisfy low-current listen mode criteria, but falls short of achieving the requisite phase noise standards for 4k-QAM modulation when not in listen mode. These challenges are compounded by the fact that VCOs demand substantial silicon die area, making it impractical to incorporate two VCOs (e.g., one high-performance NMOS LC VCO and one low-power CMOS LC VCO) on the same die. Consequently, existing solutions fail to concurrently address the issues of current draw reduction and the support of high-order modulation schemes like 4k-QAM, which demand low phase noise characteristics.

In some modern VCO-based systems, relying solely on either an NMOS LC VCO or a CMOS LC VCO imposes inherent limitations on the adaptability and capabilities of the VCO. The NMOS LC VCO excels in high-performance scenarios but draws excessive current during listen mode, while the CMOS LC VCO exhibits low current draw yet falls short in meeting the demands of high-performance settings. The impracticality of integrating both VCO types on a single die arises from the substantial silicon die area both VC types collectively occupy, making such an approach cost-prohibitive. Thus, some current VCOs require more silicon die area (e.g., to fit two VCOs onto a single die), in order to meet requirements for both high-performance and low-power scenarios.

To resolve these and other deficiencies with known approaches to employing an integrated NMOS and CMOS VCO, the present disclosure employs a switchable NMOS-CMOS VCO with a shared LC tank. In some embodiments, the switchable NMOS-CMOS VCO eliminates the need for two separate VCOs to be incorporated onto a single die because the switchable NMOS-CMOS VCO can satisfy both low-current listen mode criteria and phase noise standards for high-order modulation schemes like 4k-QAM, e.g., when not in listen mode. At the same time, the disclosed switchable NMOS-CMOS VCO with a shared LC tank maintains a competitive die area footprint because the high-performance NMOS LC VCO and the low-power CMOS LC VCO share an LC tank eliminating the need for redundant components that take up more chip area.

The devices, systems, and methods disclosed herein provide a switchable NMOS-CMOS VCO with a shared LC tank. The switchable NMOS-CMOS VCO with a shared LC tank can include a cross-coupled differential pair of NMOS transistors, an LC tank circuit coupled to the cross-coupled differential pair of NMOS transistors, and CMOS transistors selectively coupled to the LC tank circuit.

The CMOS transistors can be selectively coupled to the LC tank circuit using sets of switches. The sets of switches can be NMOS switches, for example. The switchable NMOS-CMOS VCO with a shared LC tank can also include a PMOS transistor switch coupled between a supply voltage source and a center tap of an inductor of the LC tank circuit.

The PMOS transistor switch can be opened when the sets of switches are closed and can be closed when the sets of switches are opened. For example, the sets of switches can be opened while the PMOS transistor switch is closed, causing the switchable NMOS-CMOS VCO with a shared LC tank to operate in a high-performance NMOS mode. Operating in the high-performance NMOS mode can cause switchable NMOS-CMOS VCO with a shared LC tank to meet 4k-QAM phase noise requirements. The sets of switches can be closed while the PMOS transistor switch is opened, causing the switchable NMOS-CMOS VCO with a shared LC tank to operate in a low-power CMOS mode. Operating in the low-power CMOS mode can cause the switchable NMOS-CMOS VCO with a shared LC tank to meet low-power listen mode requirements. In either operating mode, the switchable NMOS-CMOS VCO uses the single shared LC tank, thus saving valuable die area.

The switchable NMOS-CMOS VCO with a shared LC tank can be included in a multi-standard radio. In some embodiments, the switchable NMOS-CMOS VCO with a shared LC tank and the multi-standard radio can be designed to support various wireless communication standards like Wi-Fi®, Bluetooth, Zigbee, GPS, cellular, and/or the like. In some embodiments, using the switchable NMOS-CMOS VCO with a shared LC tank in a multi-standard radio can enable the multi-standard radio to be able switch between different wireless standards having a wide range of power and performance requirements.

In some embodiments, the unique ability of switchable NMOS-CMOS VCO with a shared LC tank to satisfy 4k-QAM phase noise requirements (e.g., by operating in the high-performance NMOS mode) and to meet low-power listen mode requirements (e.g., by operating in a low-power CMOS mode) can enable the system to switch between different wireless communication standards while adjusting output frequency, power level, and performance characteristics to meet the specific requirements of each standard. It should be noted that the switchable NMOS-CMOS VCO with a shared LC tank can enable such performance in a multi-standard radio despite the fact that the wireless standards may have a wide range of power and performance requirements.

The switchable NMOS-CMOS VCO with a shared LC tank can be further be included in, for example, phase-locked loops (PLLs), radio transceivers, radar systems, frequency synthesizers, clock generators, data converters, wireless communication systems, frequency modulation (FM) radios, test and measurement equipment, local oscillators, phased-array antennas, electronic musical instruments, satellite communication equipment, sensor devices, medical devices, etc.

The switchable NMOS-CMOS VCO with a shared LC tank can be included in a PLL to provide the system with a controllable and tunable frequency source that can be synchronized to an external reference. The switchable NMOS-CMOS VCO with a shared LC tank can generate a tunable output frequency that is compared to a reference frequency by a phase detector of the PLL. The phase detector can measure the phase difference between these two frequencies, and the output signal of the phase detector can be used to adjust the control voltage of the switchable NMOS-CMOS VCO with a shared LC tank. This control loop mechanism drives the frequency of the switchable NMOS-CMOS VCO with a shared LC tank closer to the reference frequency, ensuring phase and frequency lock.

Aspects of the present disclosure result in technological advantages. Aspects of the present disclosure concurrently address the issues of current draw reduction and the support of high-order modulation schemes like 4k-QAM, which demand low phase noise characteristics. Aspects of the present disclosure, eliminate the need for two separate VCOs to be incorporated onto a single die resulting in a reduced die area footprint. Aspects of the present disclosure satisfy both low-current listen mode criteria and phase noise standards for high-order modulation schemes like 4k-QAM when not in listen mode. Other advantages will be apparent to those skilled in the art of VCO design, as will be discussed hereinafter.

FIG. 1 is a block diagram of a switchable NMOS-CMOS VCO system 100, according to some embodiments (also referred to as "system" herein). System 100 includes a switchable NMOS-CMOS VCO 101. Examples of switchable NMOS-CMOS VCOs (e.g., as part of a PLL system) are shown and discussed in further detail in FIGS. 2-4B. In some embodiments, switchable NMOS-CMOS VCO 101 may be coupled to a reference frequency source 102. In some embodiments, reference frequency source 102 may input a signal to switchable NMOS-CMOS VCO 101. That input signal may be referred to as a reference signal and/or reference frequency. Reference frequency source 102 may be an electronic device or component designed to generate a stable and unvarying frequency, independent of external factors such as temperature, atmospheric conditions, voltage fluctuations, environmental changes, the passage of time, and/or the like. In some embodiments, reference frequency source 102 may be a precision crystal oscillator, providing stable and accurate frequency references for various applications. In some embodiments, reference frequency source 102 may be a precision crystal oscillator, an atomic clock, a crystal clock (XTAL CLK), a GPS disciplined oscillator, a temperature-compensated crystal oscillator, an oven-controlled crystal oscillator, an atomic frequency standard (e.g., hydrogen masers, trapped ion clocks), a rubidium oscillator, a GPS-disciplined rubidium oscillator, a quartz crystal resonator, etc.

In some embodiments, switchable NMOS-CMOS VCO 101 may be an integrated circuit coupled to reference frequency source 102. Switchable NMOS-CMOS VCO 101 and reference frequency source 102 can be implemented on the same or different circuit boards. In some embodiments, switchable NMOS-CMOS VCO 101 may be integrated into a single die with reference frequency source 102. In some embodiments, switchable NMOS-CMOS VCO 101 and reference frequency source 102 can be implemented on two dies and one package. Alternatively, switchable NMOS-CMOS VCO 101 and reference frequency source 102 can be implemented in other configurations.

In some embodiments, switchable NMOS-CMOS VCO 101 may be coupled to a supply voltage source 103. In some embodiments, supply voltage source 103 may input a voltage to switchable NMOS-CMOS VCO 101. That input voltage may be referred to as the supply voltage.

In some embodiments, supply voltage source 103 may be an electrical device that supplies electric power to an electrical load (e.g., switchable NMOS-CMOS VCO 101). For example, in some embodiments, supply voltage source 103 may be a low-dropout regulator (LDO), lithium-ion battery, coin cell battery, switching regulator, generator, solar power supply, DC-to-DC converter, AC-to-DC power supply, and/or the like. In some embodiments, switchable NMOS-CMOS VCO 101 is coupled to supply voltage source 103. In some embodiments, supply voltage source 103 includes a battery, such as a rechargeable Lithium-ion battery or a switching regulator. Alternatively, supply voltage source 103 can be other types of power supplies.

In some embodiments, switchable NMOS-CMOS VCO 101 may be coupled to a control voltage source 104. In some embodiments, control voltage source 104 may input a voltage to switchable NMOS-CMOS VCO 101. That input voltage may be referred to as a control voltage.

In some embodiments, a control voltage source refers to an electronic component or system that supplies precise voltage levels to modulate the frequency of a VCO (e.g., switchable NMOS-CMOS VCO 101). In some embodiments, control voltage source 104 may be a digital control interface that receives digital control signals and converts them into precise voltage levels to control the VCO (e.g., switchable NMOS-CMOS VCO 101). In some embodiments, control voltage source 104 may be an analog voltage input that facilitates compatibility with analog control systems and enables fine-grained adjustments to the frequency of the VCO. In some embodiments, control voltage source 104 may be a wide input voltage range that accommodates a broad range of input voltages. In some embodiments, control voltage source 104 may interface via USB, UART, SPI, and/or the like. In some embodiments, control voltage source 104 may be integrated on the same chip as switchable NMOS-CMOS VCO 101 or a different chip. Alternatively, switchable NMOS-CMOS VCO 101 and control voltage source 104 can be implemented in other configurations.

In some embodiments, switchable NMOS-CMOS VCO 101 may generate a frequency output 105. In some embodiments, frequency output 105 (e.g., of switchable NMOS-CMOS VCO 101) refers to an output frequency of an output signal, which can be precisely controlled and adjusted using an input voltage (e.g., a control voltage from control voltage source 104). Frequency output 105 may be utilized in various applications such as signal generation, modulation, communication systems, etc.

In some embodiments, an output signal (e.g., frequency output 105) from a VCO (e.g., switchable NMOS-CMOS VCO 101) may be a continuous waveform, such as a sine wave, square wave, or sawtooth wave. In some embodiments, the frequency of this output signal (e.g., frequency output 105) may be directly proportional to the input control voltage (e.g., of control voltage source 104) and can cover a wide range, for example, from low-frequency audio signals to high-frequency radio frequencies. In some embodiments, frequency output 105 may be provided to, for example, a radio.

Figure 2:
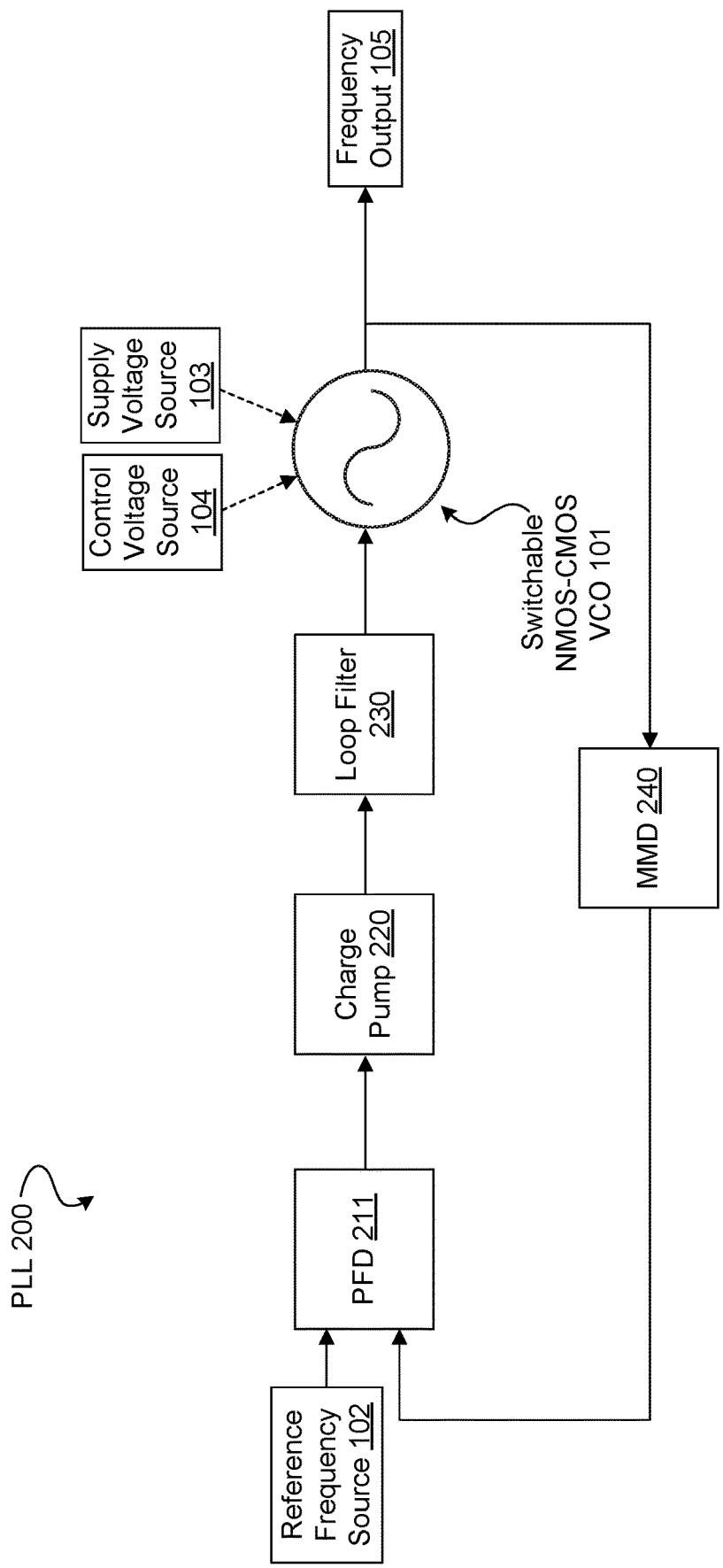
FIG. 2 is a block diagram of a switchable NMOS-CMOS VCO within a phase locked loop (PLL), according to some embodiments.

FIG. 2 is a block diagram of a switchable NMOS-CMOS VCO within a phase locked loop (PLL) 200, according to some embodiments. Switchable NMOS-CMOS VCO 101 may be similar to switchable NMOS-CMOS VCO system 100 or switchable NMOS-CMOS VCO 101 and may be described with respect to FIG. 1. For convenience and clarity, the numbers of components used in FIG. 1 are used in the present Figures. In some embodiments, switchable NMOS-CMOS VCO 101 may include or be coupled to the same, more, or fewer components.

In some embodiments, PLL 200 includes a phase frequency detector (PFD) 211. In some embodiments, a first input of PFD 211 is coupled to an output of reference frequency source 102. In some embodiments, PLL 200 includes a multi-modulus divider (MMD) 240. In some embodiments, an output of MMD 240 is coupled to a second input of PFD 211. In some embodiments, PLL 200 includes a switchable NMOS-CMOS VCO 101 that generates a frequency output 105 coupled to an input of MMD 240.

In some embodiments, switchable NMOS-CMOS VCO 101 includes a cross-coupled differential pair of NMOS transistors, an LC tank circuit coupled to the cross-coupled differential pair of NMOS transistors, sets of switches coupled to the LC tank circuit, and cross-coupled pairs of CMOS transistors selectively coupled to the LC tank circuit via the sets of switches.

In some embodiments, the cross-coupled pairs of CMOS transistors include core ultra-low voltage threshold (ULVT) radio frequency (RF) devices and the cross-coupled differential pair of NMOS transistors includes thick oxide 1.8V I/O devices.

In some embodiments, PLL 200 further includes a charge pump 220. In some embodiments, an input of charge pump 220 is coupled to an output of PFD 211. In some embodiments, PLL 200 further includes a loop filter 230. In some embodiments, an input of loop filter 230 is coupled to an output of charge pump 220, where switchable NMOS-CMOS VCO 101 is coupled to an output of loop filter 230, a control voltage source 104, and a supply voltage source 103.

In some embodiments, the sets of switches include a first set of switches coupled between the LC tank circuit and gates of the cross-coupled pairs of CMOS transistors, and a second set of switches coupled between gates of the cross-coupled differential pair of NMOS transistors and drains of the cross-coupled pairs of CMOS transistors.

In some embodiments, the cross-coupled pairs of CMOS transistors include a first PMOS transistor and a first NMOS transistor having gates coupled together and drains coupled together, and a second PMOS transistor and a second NMOS transistor having gates coupled together and drains coupled together.

In some embodiments, PLL 200 further includes sets of switches (e.g., within switchable NMOS-CMOS VCO 101). In some embodiments, the sets of switches include a first switch coupled between gates of the second PMOS transistor and second NMOS transistor, and a first side of the LC tank circuit. In some embodiments, the sets of switches include a second switch coupled between gates of the first PMOS transistor and first NMOS transistor, and a second side of the LC tank circuit. In some embodiments, the sets of switches include a third switch coupled between drains of the first PMOS transistor and first NMOS transistor, and the first side of the LC tank circuit. In some embodiments, the sets of switches include a fourth switch coupled between drains of the second PMOS transistor and second NMOS transistor, and the second side of the LC tank circuit. In some embodiments, the sets of switches may be NMOS switches.

In some embodiments, sources of the first and second PMOS transistors are coupled to supply voltage source 103. In some embodiments, switchable NMOS-CMOS VCO 101 further includes a PMOS transistor switch coupled between supply voltage source 103 and a center tap of an inductor of the LC tank circuit, where the PMOS transistor switch is to be opened when the sets of switches are closed and to be closed when the sets of switches are opened.

Figure 3:
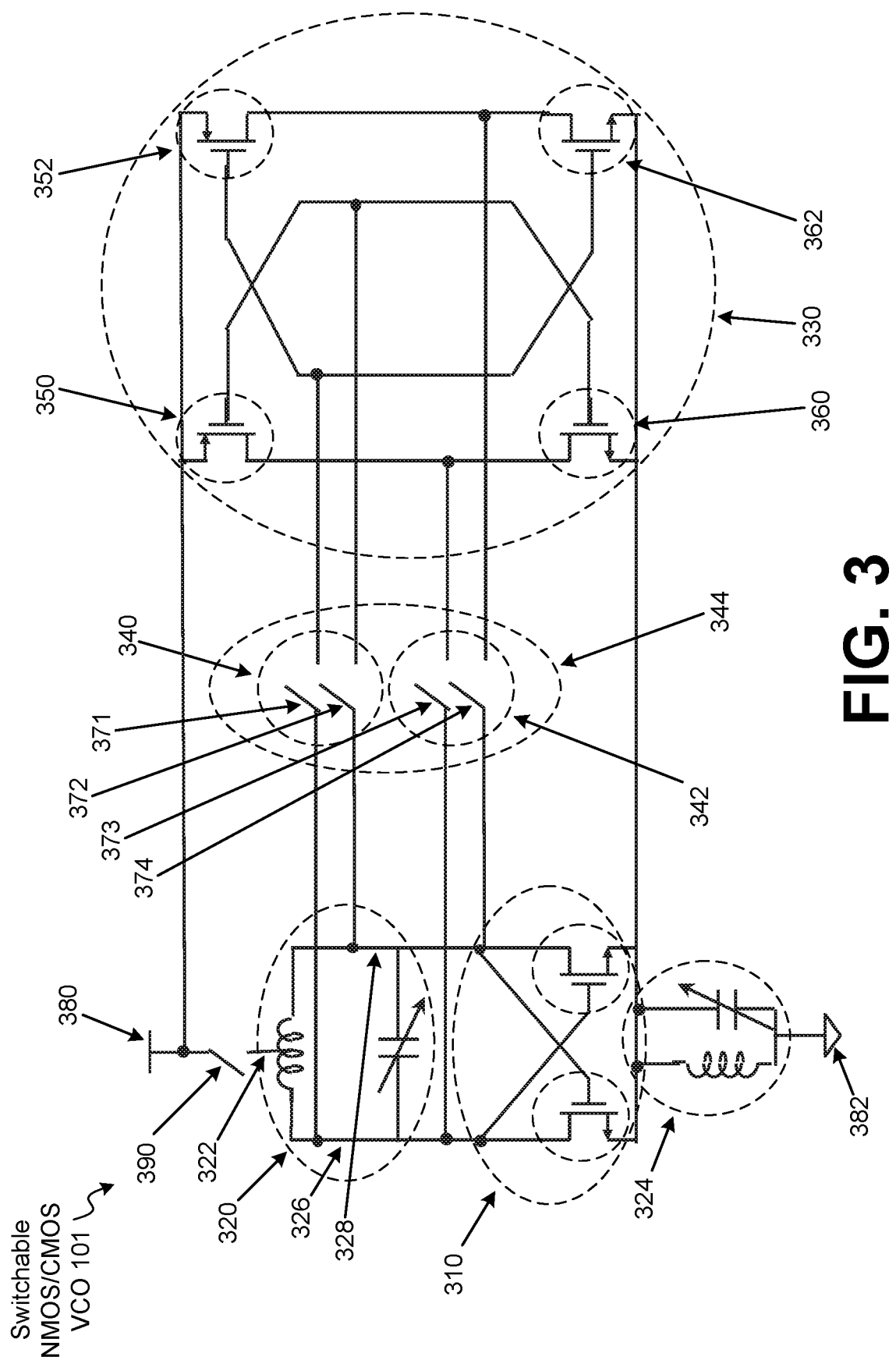
FIG. 3 is a circuit diagram illustrating a switchable NMOS-CMOS VCO with a shared inductor-capacitor (LC) tank, according to some embodiments.

FIG. 3 is a circuit diagram illustrating a switchable NMOS-CMOS VCO 101 with a shared LC tank, according to some embodiments. Switchable NMOS-CMOS VCO 101 is illustrated as a discrete device (e.g., an integrated circuit with input and output pins) for purposes of illustration, rather than limitation. For convenience and clarity, the numbers of components used in FIG. 1 are used in the present Figures.

In some embodiments, switchable NMOS-CMOS VCO 101 includes a cross-coupled differential pair of NMOS transistors 310, an LC tank circuit 320 coupled to cross-coupled pair of NMOS transistors 310, and cross-coupled pairs of CMOS transistors 330 selectively coupled to LC tank circuit 320.

In some embodiments, switchable NMOS-CMOS VCO 101 further includes a first set of switches 340 coupled between LC tank circuit 320 and gates of the cross-coupled pairs of CMOS transistors 330, and a second set of switches 342 coupled between gates of the cross-coupled differential pair of NMOS transistors 310 and drains of the cross-coupled pairs of CMOS transistors 330.

In some embodiments, cross-coupled pairs of CMOS transistors 330 include a first PMOS transistor 350 and a first NMOS transistor 360 having gates coupled together and drains coupled together, and a second PMOS transistor 352 and a second NMOS transistor 362 having gates coupled together and drains coupled together. In some embodiments, the cross-coupled pairs of CMOS transistors 330 include core ULVT RF devices and the cross-coupled differential pair of NMOS transistors 310 includes thick oxide 1.8V I/O devices.

In some embodiments, switchable NMOS-CMOS VCO 101 may include sets of switches 344. In some embodiments, sets of switches 344 may include a first switch 371 coupled between gates of the second PMOS transistor 352 and the second NMOS transistor 362, and a first side 326 of the LC tank circuit 320. The sets of switches may further include a second switch 372 coupled between gates of the first PMOS transistor 350 and the first NMOS transistor 360, and a second side 328 of the LC tank circuit 320. The sets of switches may further include a third switch 373 coupled between drains of the first PMOS transistor 350 and first NMOS transistor 360, and the first side 326 of the LC tank circuit 320. The sets of switches may further include a fourth switch 374 coupled between drains of the second PMOS transistor 352 and second NMOS transistor 362, and the second side 328 of the LC tank circuit 320. In some embodiments, the sets of switches 344 may be NMOS switches.

In some embodiments, sources of the first and second PMOS transistors 350 and 352 are coupled to a supply voltage source 380. In some embodiments, the switchable NMOS-CMOS VCO 101 further includes a PMOS transistor switch 390 coupled between the supply voltage source 380 and a center tap 322 of an inductor of the LC tank circuit 320, where the PMOS transistor switch 390 is to be opened when the sets of switches 344 are closed and to be closed when the sets of switches 344 are opened.

In some embodiments, switchable NMOS-CMOS VCO 101 includes an LC tail tank 324 coupled between the cross-coupled differential pair of NMOS transistors 310 and a ground voltage node 382. In some embodiments, LC tail tank 324 may assist in keeping impedance at two times the frequency of switchable NMOS-CMOS VCO 101 (e.g., high impedance) to prevent flicker noise up-conversion.

Figure 4A:
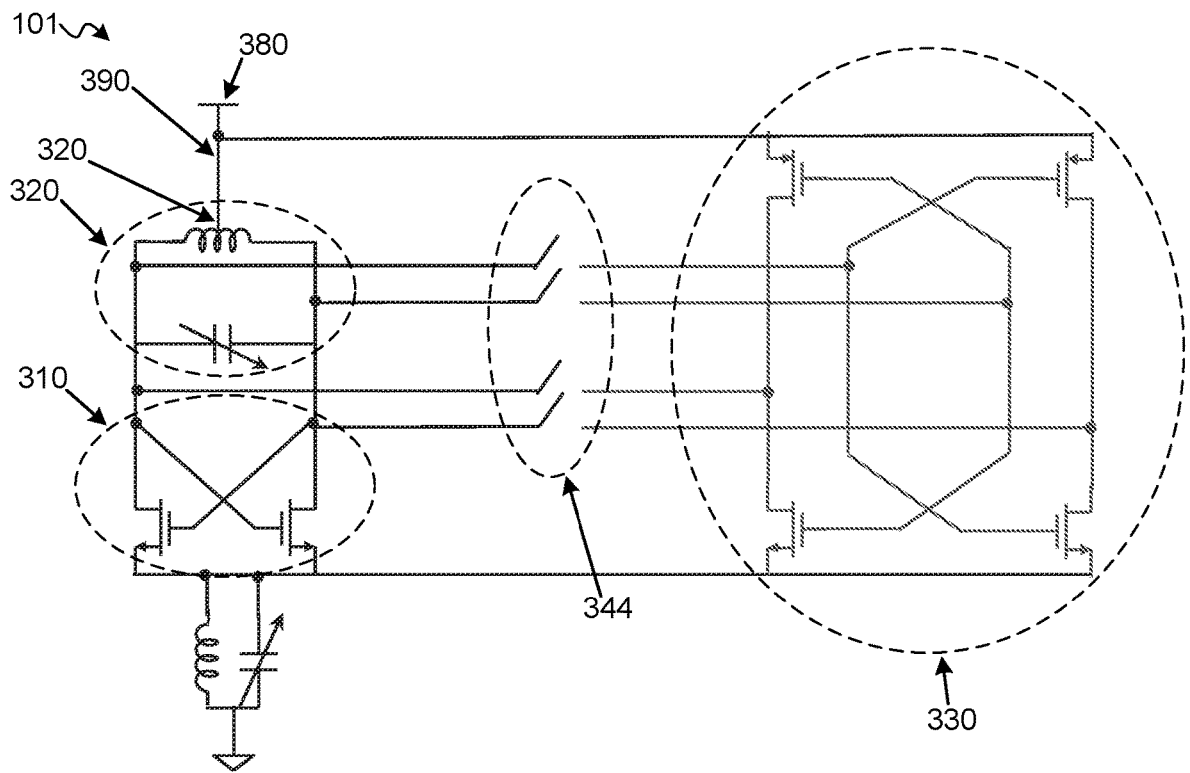
FIG. 4A is a circuit diagram illustrating a switchable NMOS-CMOS VCO with a shared LC tank in a high-performance NMOS mode, according to some embodiments.

FIG. 4A is a circuit diagram illustrating a switchable NMOS-CMOS VCO with a shared LC tank in a high performance NMOS mode, according to some embodiments.

In some embodiments, sets of switches 344 are opened while PMOS switch 390 is closed. In some embodiments, opening sets of switches 344 and closing switch 390 causes switchable NMOS-CMOS VCO 101 to operate in a high-performance mode. In some embodiments, high-performance mode uses a standard NMOS LC VCO implementation (e.g., achieved by configuring PMOS switch 390 and sets of switches 344 accordingly).

In some embodiments, operating in the high-performance NMOS mode) causes switchable NMOS-CMOS VCO to meet 4k-QAM phase noise requirements. In some embodiments, in high-performance NMOS mode, LC tank circuit 320 may have a high quality factor (Q) (e.g., while sets of switches 344 are open). Having a high Q enables VCO 101 to minimize the current while meeting 4K-QAM phase noise performance requirement. In some embodiments, cross-coupled pair of CMOS transistors 330 (e.g., CMOS core devices) are protected using 1.8V devices (e.g., causing cross-coupled pair of CMOS transistors 330 to never see large voltage swing).

In some embodiments, because an open switch (e.g., PMOS switch 390 when open) has a high impedance, there may be no impact on the quality factor (Q) of the LC tank circuit in high-performance mode (NMOS mode). In some embodiments, the center tap of the inductor of LC tank circuit 320 is selectively coupled to supply voltage source (VDD) 380 (e.g., via PMOS switch 390).

In some embodiments, when switchable NMOS-CMOS VCO 101 is in an NMOS mode (e.g., high-performance mode) the CMOS devices may be protected by disconnecting the CMOS drain/gate nets (e.g., using sets of switches 344).

Figure 4B:
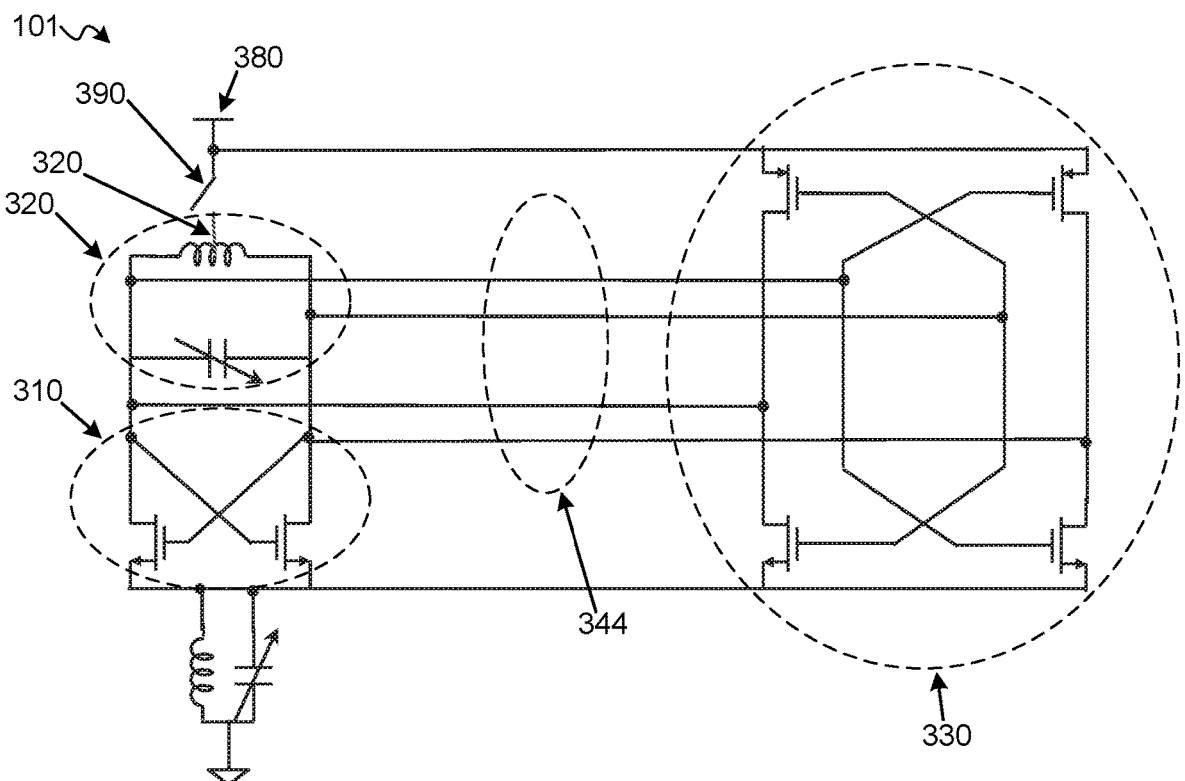
FIG. 4B is a circuit diagram illustrating a switchable NMOS-CMOS VCO with a shared LC tank in a low-power CMOS mode, according to some embodiments.

FIG. 4B is a circuit diagram illustrating a switchable NMOS-CMOS VCO with a shared LC tank in a low power CMOS mode, according to some embodiments.

In some embodiments, sets of switches 344 are closed while PMOS switch 390 is opened. In some embodiments, closing sets of switches 344 and opening switch 390 causes switchable NMOS-CMOS VCO 101 to operate in a low-power mode. In some embodiments, low-power mode uses a standard CMOS LC VCO implementation (e.g., achieved by configuring PMOS switch 390 and sets of switches 344 accordingly).

In some embodiments, operating in (the low-power CMOS mode causes switchable NMOS-CMOS VCO 101 to meet low-power listen mode requirements. In some embodiments, in low-power CMOS mode, LC tank circuit 320 may experience minor degradation in Q. In some embodiments, LC tank circuit 320 Q may be dominated by the inductor and switched capacitors with relatively little influence on the Q coming from the Gm block of the VCO. In some embodiments, low-power mode may be used for listen-only operation (e.g., MCS4), therefore the phase noise requirement is very relaxed (e.g., higher phase noise is allowable) and priority is shifted to current savings (e.g., using less current). In some embodiments, during low-power mode minor degradation in Q is allowable because it is manifested as a degradation in phase noise rather than an increase in total current. In some embodiments, the degradation in phase noise in low-power mode may be caused by the extra resistance from sets of switches 344 for the CMOS core.

In some embodiments, sets of switches 344 (e.g., selectively coupled to gates/drains of cross-coupled pairs of CMOS transistors 330) are closed when in low-power mode (CMOS Mode) and PMOS switch 390 (e.g., selectively coupled to center tap 322 of inductor of LC tank circuit 320) is opened leaving the inductor floating. In some embodiments, the CMOS switching core may be coupled to LC tank circuit 320 with 1.8V switches at the gate and drains of the CMOS switching core that connect in parallel to the LC tank circuit 320. In some embodiments, leaving the inductor floating causes current that is flowing through the VCO to originate in the CMOS devices (e.g., cross-coupled pairs of CMOS transistors 330).

In some embodiments, the combination of the NMOS LC VCO and the CMOS LC VCO allows for a switchable performance, allowing designers to have a much larger range of power targets.

As described in FIG. 3, in some embodiments, the switchable NMOS-CMOS VCO 101 includes PMOS transistor switch 390 coupled between the supply voltage source 380 and a center tap 322 of an inductor of the LC tank circuit 320. In some embodiments, PMOS transistor switch 390 is to be opened when the sets of switches 344 are closed and to be closed when the sets of switches 344 are opened (e.g., to help facilitate changing from high-performance mode to low-power mode and from low-power mode to high-performance mode). In some embodiments, sets of switches may be 1.8V switches in series with drain/gate of CMOS devices (e.g., as shown in FIG. 3).

In some embodiments, set of switches 344 may be used at the gates and drains of cross-coupled pairs of CMOS transistors 330 and PMOS switch 390 used at the center tap 322 of inductor of LC tank circuit 320 to facilitate the changing of the mode of operation. In some embodiments, significant reductions of current result. In some embodiments, an increase in phase noise results when switching from high-performance mode to low-power mode. In some embodiments, a low phase noise is not required and the increase in phase noise during low-power mode is acceptable. In some embodiments, a 75% reduction in current may be enabled by using Switchable NMOS-CMOS VCO 101. In some embodiments, the 75% reduction in current can be expected due to the topology change from high-performance NMOS mode to low-power CMOS mod. In some embodiments, a 6 dB increase in phase noise can be expected from the topology change from high-performance NMOS mode to low-power CMOS mode. The 6 dB increase in phase noise and 75% reduction in current may be intrinsic to design topologies and can be derived from Lesson's formula and/or using normal circuit analysis. In some embodiments, a minor increase in phase noise (e.g., phase noise degradation) can be expected from the inclusion of switches 344.

In some embodiments, switchable NMOS-CMOS VCO 101 may be powered by a low power BUCK converter (e.g., 0.92V BUCK converter). In some embodiments, internal LDO regulation for the switchable NMOS-CMOS VCO 101 may be lowered down to a core voltage of 0.8V. In some embodiments, the NMOS core (e.g., cross-coupled differential pair of NMOS transistors 310) may be substantially similar to and/or identical to a typical NMOS VCO.

In some embodiments, cross-coupled differential pair of NMOS transistors 310 may be 1.8V RF devices. In some embodiments, cross-coupled pairs of CMOS transistors 330 may be core ULVT RF devices.

Switchable NMOS-CMOS VCO 101 combines both a high performance NMOS cross-coupled differential pair of transistors 310 and a low-power CMOS cross-coupled pair of transistors 330 that can be switched into the same LC tank (e.g., LC tank circuit 320). Such a configuration overcomes the high current draw of a VCO (e.g., caused by the fact that a VCO must be on at any time the radio is on—either transmitting or receiving) and reduces current draw during low-power modes by utilizing a single LC tank and switching to low-power CMOS cross-coupled pair of transistors 330 during low-performance mods. Thus, a large reduction in active current can be observed that results from the topology change. Further, a VCO can occupy a large silicon die area making a two VCO solution cost prohibitive. However, switchable NMOS-CMOS VCO 101 reduces the footprint necessary to satisfy both high-performance and low-power requirements by using a shared LC tank between high performance NMOS cross-coupled differential pair of transistors 310 and low-power CMOS cross-coupled pair of transistors 330.

Figure 5:
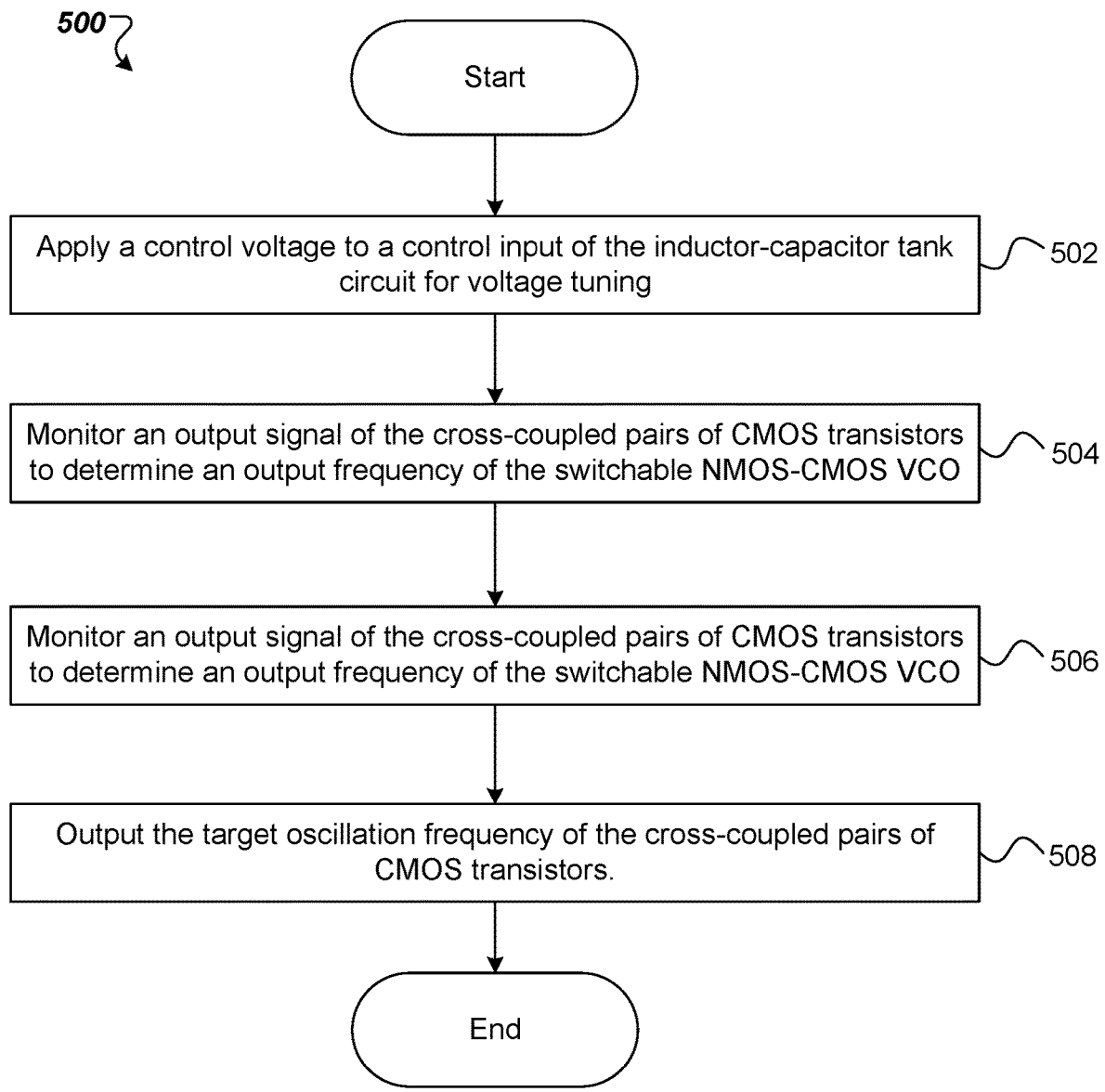
FIG. 5 is a flow diagram of a method associated with providing a controlled oscillation frequency, according to some embodiments.

FIG. 5 is a flow diagram of a method associated with providing a controlled oscillation frequency, according to some embodiments. The method 500 may be performed by processing logic that comprises hardware (e.g., circuitry, dedicated logic, programmable logic, microcode, etc.), software (such as instructions run on a processing device), or a combination thereof. The method 500 may be performed wholly or in part by switchable NMOS-CMOS VCO 101, switchable NMOS-CMOS VCO system 100, PLL 200, or components thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments, method 500 may be a method of providing a controlled oscillation frequency using a switchable NMOS-CMOS VCO. In some embodiments, the switchable NMOS-CMOS VCO providing the controlled oscillation frequency may include a first set of switches coupled between an LC tank circuit and gates of cross-coupled pairs of CMOS transistors, and a second set of switches coupled between gates of a cross-coupled differential pair of NMOS transistors and drains of the cross-coupled pairs of CMOS transistors.

Method 500 begins at operation 502, where the processing logic applies a control voltage to a control input of the LC tank circuit for voltage tuning.

At operation 504, the processing logic monitors an output signal of the cross-coupled pairs of CMOS transistors to determine an output frequency of the switchable NMOS-CMOS VCO.

At operation 506, the processing logic adjusts the control voltage applied to the control input based on the output frequency to achieve a target oscillation frequency.

In some embodiments, the adjusting of operation 506 includes switching between a high-performance cross-coupled differential pair of NMOS transistors and low-power cross-coupled pairs of CMOS transistors, where the high-performance cross-coupled differential pair of NMOS transistors and the low-power cross-coupled pairs of CMOS transistors each share an LC tank.

In some embodiments, the switchable NMOS-CMOS VCO further includes a PMOS transistor switch coupled between a supply voltage source and a center tap of an inductor of the LC tank circuit. In some embodiments, switching between the high-performance cross-coupled pair of NMOS transistors and the low-power cross-coupled pair of CMOS transistors includes opening the PMOS transistor switch when the first set of switches and the second set of switches are closed and closing the PMOS transistor switch when the first set of switches and the second set of switches are opened.

In some embodiments, the method further includes selectively coupling the cross-coupled pair of CMOS transistors coupled to the LC tank circuit using the sets of switches.

At operation 508, the processing logic outputs the target oscillation frequency of the cross-coupled pairs of CMOS transistors.

In the above description, numerous details are set forth. It will be apparent, however, to one of ordinary skill in the art having the benefit of this disclosure, that embodiments of the present disclosure may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "adjusting," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, the use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "some embodiments" throughout is not intended to mean the same embodiment or embodiments unless described as such.

Embodiments described herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, and any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details, such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or presented in simple block diagram format to avoid unnecessarily obscuring the present disclosure. Thus, the specific details set forth above are merely exemplary. Particular embodiments may vary from these exemplary details and still be contemplated to be within the scope of the present disclosure.

It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

In the above description, for purposes of explanation, numerous specific details are set forth in order to provide a thorough understanding of the present disclosure. It will be evident, however, to one skilled in the art that the present disclosure may be practiced without these specific details. In other instances, well-known circuits, structures, and techniques are not shown in detail, but rather in a block diagram in order to avoid unnecessarily obscuring an understanding of this description.

Reference in the description to "one embodiment," "an embodiment," or "some embodiments" means that a particular feature, structure, or characteristic described in connection with the embodiment(s) is included in at least one embodiment of the disclosure. The phrase "in one embodiment" or "in some embodiments" located in various places in this description does not necessarily refer to the same embodiment(s).

What is claimed is:

1. A voltage-controlled oscillator (VCO) comprising:
a cross-coupled differential pair of n-type metal-oxide semiconductor (NMOS) transistors;
an inductor-capacitor (LC) tank circuit coupled to the cross-coupled differential pair of NMOS transistors; and
cross-coupled pairs of complementary MOS (CMOS) transistors selectively coupled to the LC tank circuit, wherein the cross-coupled pairs of CMOS transistors comprise:
a first PMOS transistor and a first NMOS transistor having gates coupled together and drains coupled together; and
a second PMOS transistor and a second NMOS transistor having gates coupled together and drains coupled together.

2. The VCO of claim 1, further comprising:
a first set of switches coupled between the LC tank circuit and gates of the cross-coupled pairs of CMOS transistors; and
a second set of switches coupled between gates of the cross-coupled differential pair of NMOS transistors and drains of the cross-coupled pairs of CMOS transistors.

3. The VCO of claim 1, further comprising sets of switches comprising:
a first switch coupled between gates of the second PMOS transistor and second NMOS transistor, and a first side of the LC tank circuit;
a second switch coupled between gates of the first PMOS transistor and first NMOS transistor, and a second side of the LC tank circuit;
a third switch coupled between drains of the first PMOS transistor and first NMOS transistor, and the first side of the LC tank circuit; and
a fourth switch coupled between drains of the second PMOS transistor and second NMOS transistor, and the second side of the LC tank circuit.

4. The VCO of claim 3, wherein the sets of switches are NMOS switches.

5. The VCO of claim 3, wherein sources of the first and second PMOS transistors are coupled to a supply voltage source, the VCO further comprising a PMOS transistor switch coupled between the supply voltage source and a center tap of an inductor of the LC tank circuit, wherein the PMOS transistor switch is to be opened when the sets of switches are closed and to be closed when the sets of switches are opened.

6. The VCO of claim 5, further comprising an LC tail tank coupled between the cross-coupled differential pair of NMOS transistors and a ground voltage node.

7. The VCO of claim 1, wherein the cross-coupled pairs of CMOS transistors comprise core ultra-low voltage threshold (ULVT) radio frequency (RF) devices and the cross-coupled differential pair of NMOS transistors comprises thick oxide 1.8V I/O devices.

8. A method of providing a controlled oscillation frequency using a switchable NMOS-CMOS voltage-controlled oscillator (VCO) comprising a first set of switches coupled between an inductor-capacitor (LC) tank circuit and gates of cross-coupled pairs of CMOS transistors, and a second set of switches coupled between gates of a cross-coupled differential pair of NMOS transistors and drains of the cross-coupled pairs of CMOS transistors, the method comprising:
applying a control voltage to a control input of the LC tank circuit for voltage tuning;
monitoring an output signal of the cross-coupled pairs of CMOS transistors to determine an output frequency of the switchable NMOS-CMOS VCO;
adjusting the control voltage applied to the control input based on the output frequency to achieve a target oscillation frequency; and
outputting the target oscillation frequency of the cross-coupled pairs of CMOS transistors.

9. The method of claim 8, wherein the adjusting comprises:
switching between a high-performance cross-coupled differential pair of NMOS transistors and low-power cross-coupled pairs of CMOS transistors, wherein the high-performance cross-coupled differential pair of NMOS transistors and the low-power cross-coupled pairs of CMOS transistors each share an LC tank.

10. The method of claim 9, wherein the switchable NMOS-CMOS VCO further comprises a PMOS transistor switch coupled between a supply voltage source and a center tap of an inductor of the LC tank circuit, and wherein switching between a high-performance cross-coupled pair of NMOS transistors and a low-power cross-coupled pair of CMOS transistors comprises opening the PMOS transistor switch when the first set of switches and the second set of switches are closed and closing the PMOS transistor switch when the first set of switches and the second set of switches are opened.

11. The method of claim 8, further comprising selectively coupling the cross-coupled pair of CMOS transistors coupled to the LC tank circuit using the sets of switches.

12. A phase-locked loop (PLL) comprising:
a phase frequency detector (PFD), wherein a first input of the PFD is coupled to a reference frequency source;
a multi-modulus divider (MMD), wherein an output of the MMD is coupled to a second input of the PFD; and
a switchable n-type metal-oxide semiconductor (NMOS)-complementary MOS (CMOS) voltage-controlled oscillator (VCO) that generates a frequency output coupled to an input of the MMD, wherein the switchable NMOS-CMOS VCO comprises:
a cross-coupled differential pair of NMOS transistors;
an inductor-capacitor (LC) tank circuit coupled to the cross-coupled differential pair of NMOS transistors;
sets of switches coupled to the LC tank circuit; and
cross-coupled pairs of CMOS transistors selectively coupled to the LC tank circuit via the sets of switches.

13. The PLL of claim 12, further comprising:
a charge pump, wherein an input of the charge pump is coupled to an output of the PFD; and
a loop filter, wherein an input of the loop filter is coupled to the output of the charge pump, wherein the switchable NMOS-CMOS VCO is coupled to an output of the loop filter, a control voltage source, and a supply voltage source.

14. The PLL of claim 13, wherein the sets of switches comprise:
a first set of switches coupled between the LC tank circuit and gates of the cross-coupled pairs of CMOS transistors; and
a second set of switches coupled between gates of the cross-coupled differential pair of NMOS transistors and drains of the cross-coupled pairs of CMOS transistors.

15. The PLL of claim 13, wherein the cross-coupled pairs of CMOS transistors comprise:
- a first PMOS transistor and a first NMOS transistor having gates coupled together and drains coupled together; and
- a second PMOS transistor and a second NMOS transistor having gates coupled together and drains coupled together.

16. The PLL of claim 15, further comprising sets of switches comprising:
- a first switch coupled between gates of the second PMOS transistor and second NMOS transistor, and a first side of the LC tank circuit;
- a second switch coupled between gates of the first PMOS transistor and first NMOS transistor, and a second side of the LC tank circuit;
- a third switch coupled between drains of the first PMOS transistor and first NMOS transistor, and the first side of the LC tank circuit; and
- a fourth switch coupled between drains of the second PMOS transistor and second NMOS transistor, and the second side of the LC tank circuit.

17. The PLL of claim 16, wherein the sets of switches are NMOS switches.

18. The PLL of claim 16, wherein sources of the first and second PMOS transistors are coupled to a supply voltage source, the VCO further comprising a PMOS transistor switch coupled between the supply voltage source and a center tap of an inductor of the LC tank circuit, wherein the PMOS transistor switch is to be opened when the sets of switches are closed and to be closed when the sets of switches are opened.

19. The PLL of claim 12, wherein the cross-coupled pairs of CMOS transistors comprise core ultra-low voltage threshold (ULVT) radio frequency (RF) devices and the cross-coupled differential pair of NMOS transistors comprises thick oxide 1.8V I/O devices.

* * * * *